(12) United States Patent
Shim et al.

(10) Patent No.: US 7,445,955 B2
(45) Date of Patent: *Nov. 4, 2008

(54) MULTICHIP MODULE PACKAGE AND FABRICATION METHOD

(75) Inventors: Il Kwon Shim, Singapore (SG); Dario S Filoteo, Jr., Singapore (SG); Tsz Yin Ho, Singapore (SG); Sebastian T. M. Soon, Singapore (SG)

(73) Assignee: Stats Chippac Ltd., Singapore (SG)

( * ) Notice: Subject to any disclaimer, the term of this patent is extended or adjusted under 35 U.S.C. 154(b) by 370 days.

This patent is subject to a terminal disclaimer.

(21) Appl. No.: 11/160,837

(22) Filed: Jul. 12, 2005

(65) Prior Publication Data

US 2006/0043560 A1 Mar. 2, 2006

Related U.S. Application Data

(63) Continuation of application No. 10/931,654, filed on Aug. 31, 2004, now Pat. No. 6,943,057.

(51) Int. Cl.
*H01L 21/44* (2006.01)
*H01L 21/48* (2006.01)
*H01L 21/50* (2006.01)

(52) U.S. Cl. .............. 438/106; 438/122; 257/E21.499
(58) Field of Classification Search .......... 438/106–108, 438/122, 125, 110; 257/E21.499
See application file for complete search history.

(56) References Cited

U.S. PATENT DOCUMENTS 5,396,403 A * 3/1995 Patel .................... 361/705
2004/0212071 A1 * 10/2004 Moshayedi ............ 257/686

* cited by examiner

*Primary Examiner*—Hoai V Pham
(74) *Attorney, Agent, or Firm*—Mikio Ishimaru

(57) ABSTRACT

A method for fabricating a multichip module package includes providing a first heat sink positioned for releasing heat from the package and providing a second heat sink positioned proximate the first heat sink. The heat sinks are thermally coupled and electrically isolated to and from one another. A first semiconductor device is attached to the first heat sink in thermal and electrical communication therewith and electrically insulated from the second heat sink. A second semiconductor device is attached to the second heat sink in thermal and electrical communication therewith and electrically insulated from the first heat sink.

10 Claims, 2 Drawing Sheets

MULTICHIP MODULE PACKAGE AND FABRICATION METHOD

CROSS-REFERENCE TO RELATED APPLICATION(S)

This is a continuation of application Ser. No. 10/931,654 filed Aug. 31, 2004, now U.S. Pat. No. 6,943,057, which is hereby incorporated by reference herein.

TECHNICAL FIELD

The present invention relates generally to semiconductor packages, and more particularly to multichip module packages and methods for the fabrication thereof.

BACKGROUND ART

The computer industry continually strives toward higher performance, lower cost, increased miniaturization of components, and greater packaging density of integrated circuits ("IC's"). As new generations of IC products are released, their functionality increases while the number of components needed to produce them decreases.

Semiconductor devices are constructed from a silicon ("Si") or gallium arsenide ("GaAs") wafer through a process that comprises a number of deposition, masking, diffusion, etching, and implanting steps. Usually, many individual devices are constructed on the same wafer. When the devices are separated into individual rectangular units, each takes the form of an IC die.

In order to interface a die with other circuitry, it is common to mount it on a leadframe or on a multichip module substrate that is surrounded by a number of lead fingers. Each die has bonding pads that are then individually connected in a wire-bonding operation to the leadframe's lead fingers using extremely fine gold ("Au") or aluminum ("Al") wires. The assemblies are then packaged by individually encapsulating them in molded plastic or ceramic bodies.

IC packaging technology has shown an increase in semiconductor chip density (the number of chips mounted on a single circuit board or substrate) that parallels the reduction in the number of components that are needed for a circuit. This results in packaging designs that are more compact, in form factors (the physical size and shape of a device) that are more compact, and in a significant increase in overall IC density. However, IC density continues to be limited by several factors.

One factor that limits IC density is the space (or "real estate") available for mounting individual dies on a substrate. Another limiting factor is the increasing need for higher and higher heat dissipation due not only to the higher density IC integration levels, but also due to the ever-increasing operating frequencies of the semiconductor devices. Still another limiting factor is the need to provide customized physical and electrical support for the differing individual needs of the semiconductor devices in such high density configurations.

To increase heat dissipation, thermally enhanced package designs, such as enhanced ball grid array ("EBGA") packages, have been developed. Such packages are particularly directed to high-level integration devices, and utilize a heat sink to dissipate the considerable heat that is generated by the high-power semiconductor devices contained therein.

To further condense the packaging of individual devices, multichip-module ("MCM") packages have been developed in which more than one semiconductor device can be included in the same package. Examples of thermally enhanced multifunctional ball grid array ("BGA") packages include the MCM enhanced BGA ("MCM-EBGA") with an attached multicavity heat spreader, and the MCM drop-in heat spreader for plastic BGA ("PBGA") packages. These higher integration techniques provide for mixed signal packages that enable higher functionality, allowing, for example, different chip sets to be integrated into a single package to provide multifunctional performance.

In some cases, multichip devices can be fabricated faster and more cheaply than a corresponding single IC die that incorporates the same features and functions. Some MCM's consist of a printed circuit board ("PCB") substrate onto which a set of separate IC chip components is directly attached. Other MCM's mount and attach multiple dies on a single leadframe. Following assembly, the MCM's are then encapsulated to prevent damage or contamination. Many such MCM's have greatly increased circuit density and miniaturization, improved signal propagation speed, reduced overall device size and weight, improved performance, and lowered costs—all primary goals of the computer industry.

Of importance to such complicated packaging designs are considerations of input/output lead count, heat dissipation, the differing voltage requirements of the several semiconductor devices in the packages, matching of thermal expansion and contraction between a motherboard and its attached components, costs of manufacturing, ease of integration into an automated manufacturing facility, package reliability, and easy adaptability of the package to additional packaging interfaces such as a PCB.

Unfortunately, existing multichip modules do not satisfactorily meet these requirements. For example, existing MCM-EBGA designs employ a single heat sink plane and therefore do not make different die backside electrical potentials available for the various semiconductor devices therein. Thermally enhanced PBGA designs utilize a drop-in heat spreader that accommodates high-power devices that need considerable heat dissipation but cannot support certain different die backside potentials.

Thus, despite the advantages of recent developments in semiconductor fabrication and packaging techniques, there is a continuing need for improved packaging designs, systems, and methods to enable increased semiconductor die density in multichip packages. A need particularly remains for such improved package solutions that have enhanced thermal performance while simultaneously being capable of integrating multi-chipsets that require different die backside potentials. In view of the need to increase package efficiency and capacity, reduce package thicknesses, increase package heat dissipation capabilities, and support multiple die backside potentials, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for fabricating a multichip module package. A first heat sink is provided and positioned for releasing heat from the package. A second heat sink is provided and positioned proximate the first heat sink. The heat sinks are thermally coupled and electrically isolated to and from one another. A first semiconductor device is attached to the first heat sink in thermal and electrical communication therewith and electrically insulated from the second heat sink. A second semiconductor device is attached to the second heat sink in thermal and electrical communication therewith and electrically insulated from the first heat sink.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
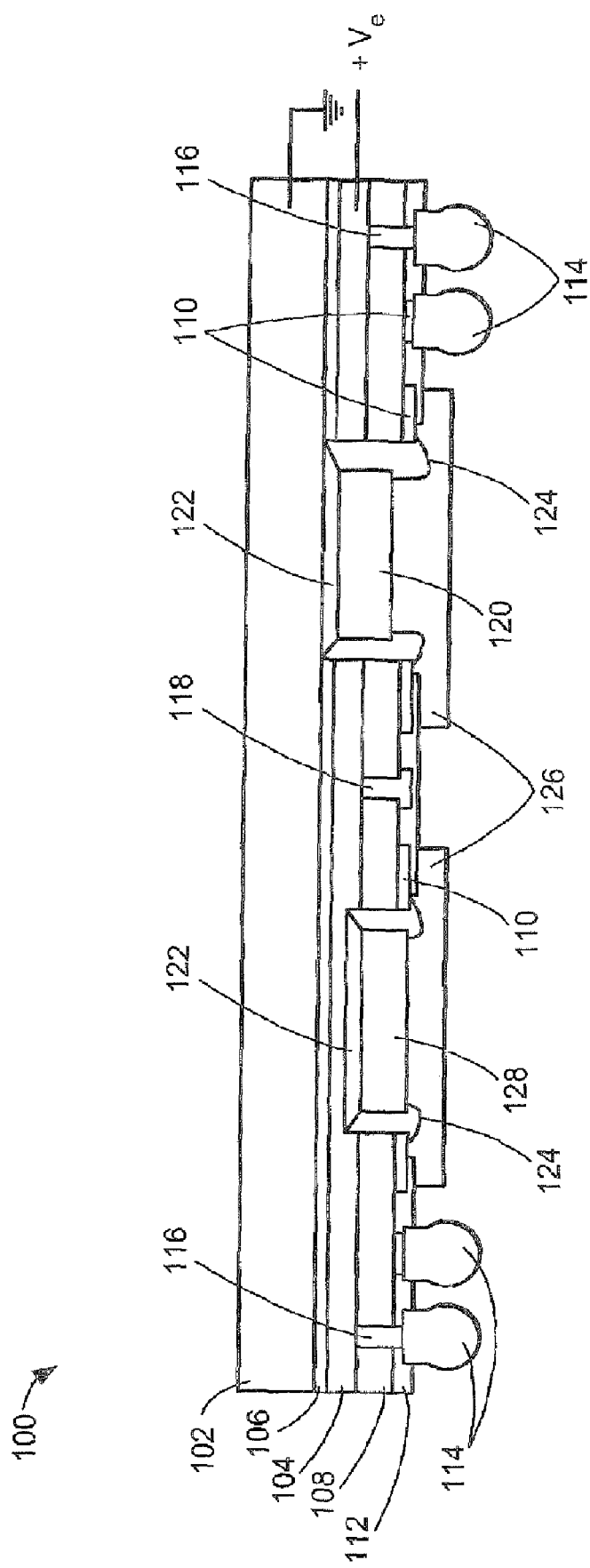
FIG. 1 is a figurative cross-sectional view of a multichip module package according to an embodiment of the present invention.

In the following description, numerous specific details are given to provide a thorough understanding of the invention. However, it will be apparent that the invention may be practiced without these specific details. In order to avoid obscuring the present invention, some well-known package circuit configurations and fabrication process steps are not disclosed in detail. Likewise, the drawings showing embodiments of the device are semi-diagrammatic and not to scale and, particularly, some of the dimensions are for the clarity of presentation and may be exaggerated. Also, for clarity and ease of illustration, description, and comprehension, similar and like features one to another will typically be described with like reference numerals.

The term "horizontal" as used herein is defined as a plane parallel to the conventional plane or surface of a multichipmodule ("MCM") package, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The present invention relates generally to semiconductor packages, such as MCM packages, and to methods for the fabrication thereof. It particularly addresses the continuing need to increase the density of integrated circuit ("IC") packaging, by overcoming several of the limiting factors related thereto.

One such limiting factor is the space (or "real estate") that is available for mounting individual semiconductor dies on a substrate. Another limiting factor is the need for higher and higher levels of heat dissipation due, in part, to higher density IC integration levels and the ever-increasing operating frequencies of semiconductor devices. Still another limiting factor is the need to provide customized physical and electrical support for the differing needs of the several semiconductor devices in such high density configurations.

To further increase IC packaging density, MCM packages have therefore been developed in which more than one semiconductor device can be included in the same package. These higher integration techniques provide for mixed signal packages that enable higher functionality, allowing, for example, different chip sets to be integrated into a single package to provide multifunctional performance. Some MCM's consist of a printed circuit board ("PCB") substrate onto which a set of separate IC chip components is directly attached. Other MCM's mount and attach multiple dies on a single leadframe. Following assembly, the MCM's are encapsulated to prevent damage or contamination.

Unfortunately, existing multichip modules do not satisfactorily meet all the requirements of complicated packaging designs. For example, existing MCM enhanced ball grid array ("MCM-EBGA") designs employ a single heat sink plane and therefore do not make different die backside electrical potentials available for the various semiconductor devices therein. Thermally enhanced plastic ball grid array ("PBGA") designs utilize a drop-in heat spreader that accommodates high-power devices that need considerable heat dissipation but cannot support certain different die backside potentials.

A need thus particularly remains for improved package solutions that have enhanced thermal performance while simultaneously being capable of integrating multi-chipsets that require different die backside potentials. Advantageously, these prior art needs and limitations are overcome by the present invention.

Referring now to FIG. 1, therein is shown a figurative cross-sectional view of an MCM package 100 according to an embodiment of the present invention. The MCM package 100, as depicted in FIG. 1, is an MCM-EBGA package. However, it will be readily understood, based upon the disclosure of the embodiments of the present invention, that the teachings hereof may be readily incorporated into other MCM package configurations as well.

The MCM package 100 includes a first heat sink 102 on the top thereof and positioned, such as at or near the package surface, for releasing heat from the MCM package 100. A second heat sink 104 is positioned proximate the first heat sink 102. The first and second heat sinks 102 and 104 may be planar in two parallel planes, as shown, with the second heat sink 104 positioned beneath the first heat sink 102. The heat sinks 102 and 104 are attached to one another by an adhesive layer 106 therebetween. In one embodiment, the adhesive layer 106 is an electrically insulating but thermally conducting adhesive layer. The electrically insulating property allows the voltage (or potential) on each of the heat sinks 102 and 104 to be at different levels. By thus providing a plurality of heat sinks that are electrically insulated from one another, various semiconductor devices that require different respective electrical potentials can be accommodated, as further described herein.

By using an adhesive that is thermally conducting, one or more heat sinks may be located within the MCM package, away from the outer surface thereof, according to the design considerations at hand. The heat that is absorbed by each of the heatsinks (e.g., the second heat sink 104) within the MCM package will be conducted by the adhesive layer (e.g., the adhesive layer 106) to those heat sinks (e.g., the first heat sink 102) that are located on or at the exterior of the package (e.g., the MCM package 100).

A substrate 108 is self-adhered to the second heat sink 104, on the bottom side thereof opposite the adhesive layer 106 and the first heat sink 102 thereabove. The substrate 108 may be a conventional substrate such as used in ball grid array ("BGA") packages, for example, a pre-impregnated bismaleimide triazine ("BT") substrate.

Circuitry 110, such as conventional printed circuitry, is located and configured in known fashion on the bottom of the substrate 108, on the side thereof opposite the second heat sink 104, for electrically interconnecting the various circuit components that are to be mounted on the substrate 108 for incorporation into the MCM package 100.

A solder mask 112 coats and covers the bottom of the substrate 108 and the circuitry 110 thereon, in conventional fashion, to provide an electrical and environmental barrier for the MCM package 100. Similarly, in known fashion, solder balls 114 are attached to and supported on the solder mask 112 for electrically interfacing the MCM package 100 to other electrical circuitry and/or circuit boards (not shown), as may be desired. The solder balls 114 make contact with electrical elements within the MCM package 100 such as elements of the circuitry 110, vias 116 and 118, and so forth.

A first semiconductor device 120, such as a semiconductor die, is mounted in the substrate 108 and extends therethrough and through the second heat sink 104 and the adhesive layer 106 to the first heat sink 102. The opening for the first semiconductor device 120 through the second heat sink 104 is larger than the lateral dimensions of the first semiconductor device 120, as illustrated, to separate and electrically insulate it from the second heat sink 104. An electrically and thermally conductive epoxy 122 secures and electrically and thermally connects the backside (i.e., the top) of the first semiconductor device 120 to the first heat sink 102 in thermal and electrical communication therewith. On the opposite side of the first semiconductor device 120, bonding wires 124 electrically connect bonding pads (not shown) on the first semiconductor device 120 to the circuitry 110 in conventional fashion.

An encapsulant 126 then seals the first semiconductor device 120 and the bonding wires 124 within the MCM package 100. The encapsulant 126 surrounds and separates the sides and bottom of the first semiconductor device 120, environmentally protecting it and insulating it electrically from the second heat sink 104.

A second semiconductor device 128 is also mounted in and extends through the substrate 108. However, the second semiconductor device 128 is positioned lower within the MCM package 100, electrically contacting rather than penetrating the second heat sink 104. Thus, the backside of the second semiconductor device 128 is electrically and thermally connected to the second heat sink 104, in thermal and electrical communication therewith, by a layer of the electrically and thermally conductive epoxy 122. Additional bonding wires 124 then electrically connect the bonding pads (not shown) of the second semiconductor device 128 to respective portions of the circuitry 110, and additional encapsulant 126 electrically and environmentally seals the second semiconductor device 128 within the MCM package 100.

In one embodiment, the MCM package 100 is thus configured such that a first electrical potential, such as a ground electrical potential, can be applied to the first heat sink 102, and this potential will be applied through the electrically and thermally conductive epoxy 122 at the first semiconductor device 120 to the backside thereof. The configuration of the MCM package 100 is also such that a second, different electrical potential, such as a potential of $+V_e$, can be applied to the second heat sink 104, and will then be similarly applied through the electrically and thermally conductive epoxy 122 at the second semiconductor device 128 to the backside thereof. In this manner, different respective backside electrical potentials can be provided, through the respective heat sinks, to the different respective semiconductor devices according to the needs thereof.

Based on this disclosure, it can now be seen that additional potentials of different voltages for additional devices may similarly be supplied either by partitioning the heat sinks into different segments, according to the locations of the several devices, by providing additional heat sink layers, or by combinations of both of these solutions. Suitable external connections for applying these potentials to the heat sinks that are internal to the MCM packages can be provided, for example, through corresponding solder balls 114 and vias 116 connected thereto, such as illustrated. Similarly, connections internally to the circuitry 110 to and from the various heat sinks can be provided, for example, by vias such as illustrated by the via 118.

Figure 2:
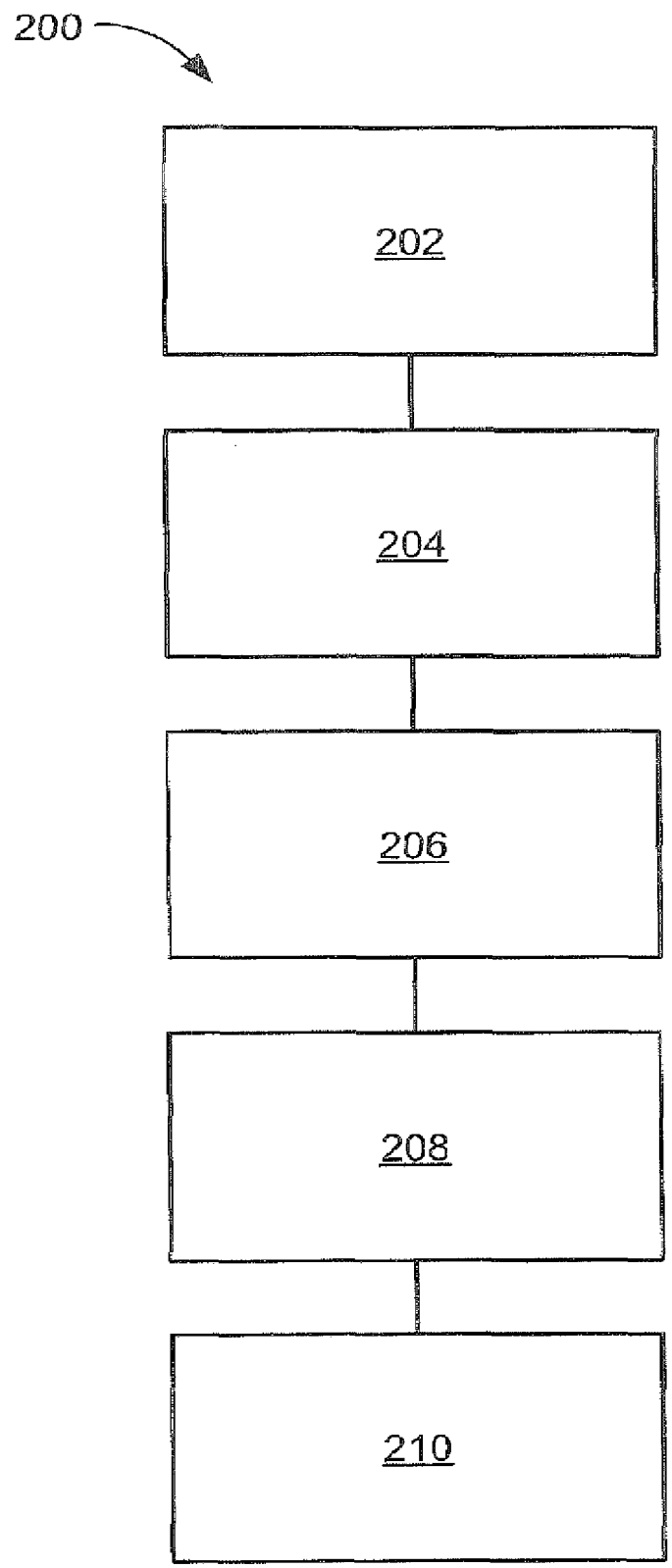
FIG. 2 is a flow chart of a method for fabricating a multichip module package in accordance with an embodiment of the present invention.

Referring now to FIG. 2, therein is shown a flow chart of a method 200 for fabricating a multichip module package in accordance with an embodiment of the present invention. The method 200 includes providing a first heat sink positioned for releasing heat from the package in a block 202; providing a second heat sink positioned proximate the first heat sink in a block 204; thermally coupling and electrically isolating the heat sinks to and from one another in a block 206; attaching a first semiconductor device to the first heat sink in thermal and electrical communication therewith and electrically insulated from the second heat sink in a block 208; and attaching a second semiconductor device to the second heat sink in thermal and electrical communication therewith and electrically insulated from the first heat sink in a block 210.

Thus, it has been discovered that the MCM package fabrication method and apparatus of the present invention furnish important and heretofore unknown and unavailable solutions, capabilities, and functional advantages for increasing the integration of semiconductor device packages, such as the BGA family of packages. More particularly, the present invention provides improved package solutions that have enhanced thermal performance and that simultaneously integrate and support multi-chipsets with different die backside potentials, using electrically isolated heat spreaders. The resulting processes and configurations are thus straightforward, economical, uncomplicated, highly versatile and effective, can be implemented by adapting known technologies, and are thus readily suited for the highly efficient manufacturing of highly integrated MCM packages using conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method for fabricating a multichip module package, comprising:
   providing a first heat sink positioned for releasing heat from the package;
   providing a second heat sink positioned proximate the first heat sink and bonded thereto;
   thermally coupling and electrically isolating the heat sinks to and from one another;
   attaching a first semiconductor device to the first heat sink in thermal and electrical communication therewith and electrically insulated from the second heat sink; and
   attaching a second semiconductor device to the second heat sink in thermal and electrical communication therewith and electrically insulated from the first heat sink.

2. The method of claim 1 further comprising:
   attaching a substrate to the second heat sink on the side thereof opposite the first heat sink;
   providing electrical circuitry on the substrate on the side thereof opposite the second heat sink; and
   electrically connecting the semiconductor devices to the electrical circuitry.

3. The method of claim 1 further comprising connecting the semiconductor devices to their respective heat sinks by an electrically conductive epoxy.

4. The method of claim 1 wherein providing a first heat sink and providing a second heat sink further comprise providing heat sinks that are planar in two substantially parallel planes.

5. The method of claim 1 further comprising configuring the package for applying different electrical potentials respectively to the first heat sink and to the second heat sink.

6. A method for fabricating a multichip module package, comprising:

providing a first heat sink positioned for releasing heat from the package;

providing a second heat sink positioned beneath the first heat and adhesively bonded thereto:

thermally coupling and electrically isolating the heat sinks to and from one another;

attaching a substrate to the second heat sink on the side thereof opposite the first heat sink;

attaching a first semiconductor device to the first heat sink through and in thermal and electrical communication therewith and electrically insulated from the second heat sink;

attaching a second semiconductor device to the second heat sink in thermal and electrical communication therewith and electrically insulated from the first heat sink; and environmentally encapsulating the first and second semiconductor devices.

7. The method of claim 6 further comprising providing electrical circuitry on the substrate opposite the second heat sink and electrically connecting the semiconductor devices thereto.

8. The method of claim 6 further comprising connecting the semiconductor devices to their respective heat sinks by an electrically conductive epoxy 9. The method of claim 6 wherein providing a first heat sink and providing a second heat sink further comprise providing heat sinks that are planar in two substantially parallel planes.

10. The method of claim 6 further comprising configuring the package for applying different electrical potentials respectively to the first heat sink and to the second heat sink.

\* \* \* \* \*

UNITED STATES PATENT AND TRADEMARK OFFICE
CERTIFICATE OF CORRECTION

PATENT NO. : 7,445,955 B2
APPLICATION NO. : 11/160837
DATED : November 4, 2008
INVENTOR(S) : Shim et al.

Page 1 of 1

It is certified that error appears in the above-identified patent and that said Letters Patent is hereby corrected as shown below:

Column 7, claim 6, line 12, delete "heat" and insert therefor --heat sink--

Column 7, claim 6, line 12, delete "thereto:" and insert therefor --thereto;--

Signed and Sealed this
Twenty-third Day of August, 2011

David J. Kappos
*Director of the United States Patent and Trademark Office*